United States Patent
Kumar et al.

(10) Patent No.: US 12,272,426 B2
(45) Date of Patent: Apr. 8, 2025

(54) DUTY CYCLE ADJUSTER OPTIMIZATION TRAINING ALGORITHM TO MINIMIZE THE JITTER ASSOCIATED WITH DDR5 DRAM TRANSMITTER

(71) Applicant: Intel Corporation, Santa Clara, CA (US)

(72) Inventors: Arvind Kumar, Palo Alto, CA (US); Dean-Dexter R. Eugenio, Folsom, CA (US); Santhosh Muskula, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 779 days.

(21) Appl. No.: 17/354,788

(22) Filed: Jun. 22, 2021

(65) Prior Publication Data

US 2021/0390991 A1  Dec. 16, 2021

(51) Int. Cl.
*G11C 7/00* (2006.01)
*G11C 7/10* (2006.01)
*G11C 7/22* (2006.01)
*G11C 8/18* (2006.01)
*H03K 3/017* (2006.01)
*H03K 5/156* (2006.01)

(52) U.S. Cl.
CPC ............ *G11C 7/222* (2013.01); *G11C 7/1066* (2013.01); *G11C 7/1093* (2013.01); *G11C 8/18* (2013.01); *H03K 3/017* (2013.01); *H03K 5/1565* (2013.01)

(58) Field of Classification Search
CPC ......... G11C 7/222; G11C 8/18; G11C 29/023; G11C 29/028; G11C 16/08; G11C 16/28; G11C 16/32; G11C 7/1066; G11C 7/1093; G11C 11/4093; G11C 2207/2254; G11C 5/04; G11C 7/22; G11C 7/1072; G11C 11/4076; G11C 7/1051; G11C 5/063; G11C 7/1087; G11C 7/1078; G11C 11/406; G11C 11/4074; G11C 2029/0411; G11C 2211/4067; G11C 29/42; G11C 7/106; G11C 7/1039; G11C 7/1048; G11C 7/1063; G11C 11/21; G11C 11/40; G11C 2207/2227; G11C 29/50012; G11C 7/109; G11C 7/225
See application file for complete search history.

(56) References Cited

U.S. PATENT DOCUMENTS 10,395,704 B2 * 8/2019 Lee .................. G11C 16/08

* cited by examiner

*Primary Examiner* — Thong Q Le
(74) *Attorney, Agent, or Firm* — Compass IP Law PC

(57) ABSTRACT

Methods and apparatus for duty cycle adjuster optimization training algorithms to minimize jitter associated with DDR5 DRAM transmitters. Basic and Advanced Duty Cycle Adjuster (DCA) training algorithms are implemented to reduce duty cycle error and hence reduce phase mismatch translated jitter in the transmitter DQS signals. In accordance with aspects of the Basic DCA training algorithm, duty cycles for QCLK, IBQCLK, and QBCLK are adjusted by a memory controller that utilizes a DCA function implemented on a memory module (e.g., DDR5 SDRAM DIMM) to obtain a first set of optimized DCA code settings. The first set of optimized DCA code settings are then used as initial settings for the Advance DCA training algorithm to further optimize the DCA code settings for QCLK, IBQCLK, and QBCLK. A similar technical may be employed to reduce duty cycle error and jitter for DQ signals.

20 Claims, 9 Drawing Sheets

DUTY CYCLE ADJUSTER OPTIMIZATION TRAINING ALGORITHM TO MINIMIZE THE JITTER ASSOCIATED WITH DDR5 DRAM TRANSMITTER

BACKGROUND INFORMATION

DDR (Double Data Rate) is a class of memory that enables data transfers on both edges of the clock and hence is a very popular choice for systems that are constantly pushing the performance envelope. DDR5 is the fifth-generation DDR SDRAM (Synchronous Dynamic Random Access Memory), the successor of DDR4, and has been developed to deliver performance improvements at a time when system designers are feeling increasing pressure from continuous technological advancements—where current memory bandwidth is simply unable to keep up with newer processor models that have increasing core counts. While previous generations of DDR focused on reducing power consumption and were driven by applications such as mobile and datacenter, DDR5's primary driver has been the need for more bandwidth.

One way DDR5 SDRAM provides increased bandwidth is by supporting a substantial increase in the I/O (Input/Output) switching rate (data) rate (up to 6400 MT/s). Several new features are defined under DDR5 to enable this data rate increase, including a Duty Cycle Adjuster (DCA) circuit, a DQS interval oscillator circuit, new and improved training modes, Read training patterns with dedicated mode registers, and internal reference voltages for the command and address pins (VREFCA) and chip select pin (VREFCS).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Figure 1:
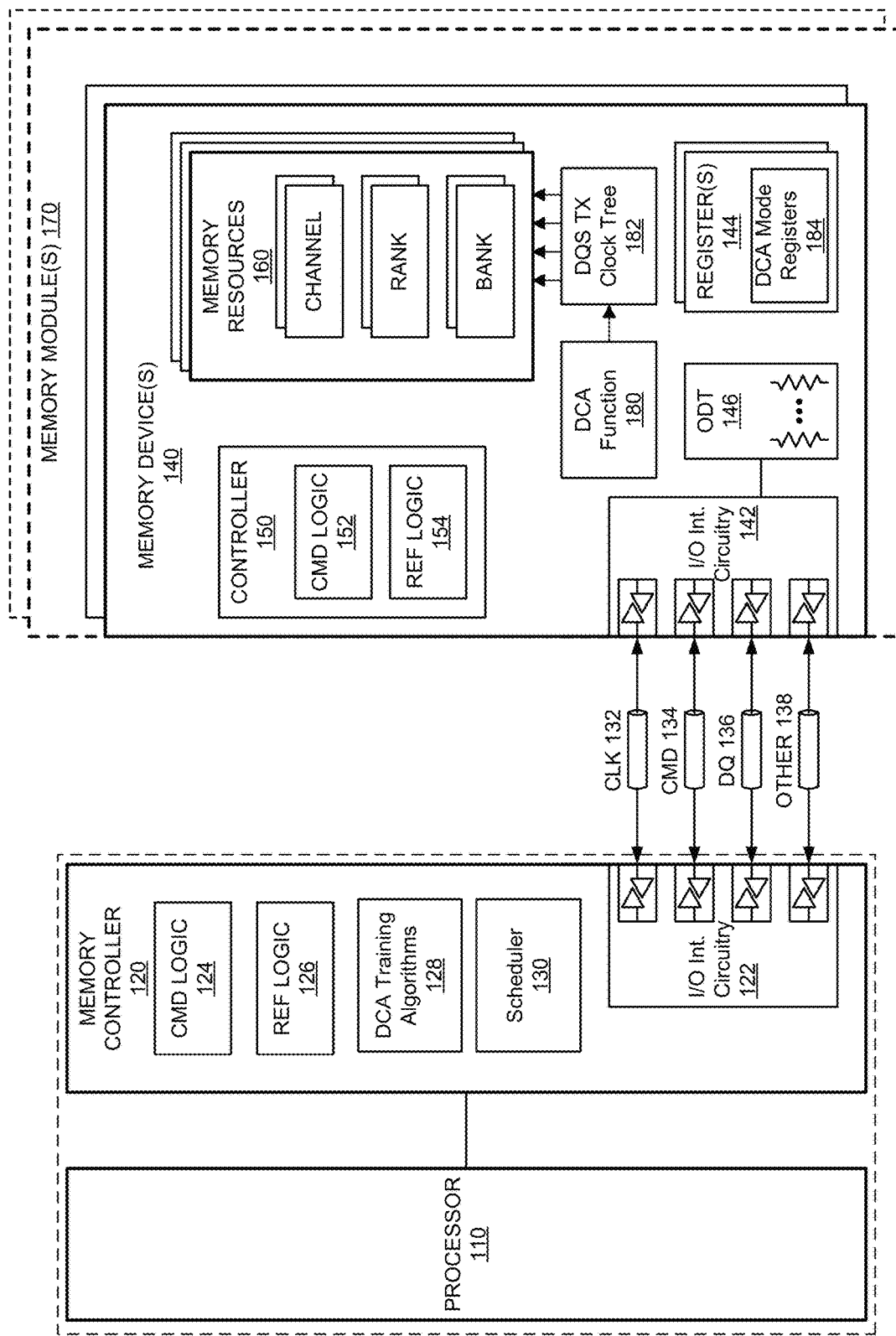
FIG. 1 is a schematic diagram of an example system including a memory controller and memory modules configured to implement DCA training algorithms, according to one embodiment.

Embodiments of methods and apparatus for duty cycle adjuster optimization training algorithms to minimize the jitter associated with DDR5 DRAM transmitters are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

As described herein, reference to memory devices can apply to different memory types. Memory devices may refer to volatile memory technologies. Volatile memory is memory whose state (and therefore the data stored on it) is indeterminate if power is interrupted to the device. Non-volatile memory refers to memory whose state is determinate even if power is interrupted to the device. Dynamic volatile memory requires refreshing the data stored in the device to maintain state. One example of dynamic volatile memory includes dynamic random access memory (DRAM), or some variant such as synchronous DRAM (SDRAM). A memory subsystem as described herein may be compatible with a number of memory technologies or standards, such as DDR3 (double data rate version 3, JESD79-3, originally published by JEDEC (Joint Electronic Device Engineering Council) on Jun. 27, 2007), DDR4 (DDR version 4, JESD79-4, originally published in September 2012 by JEDEC), LPDDR3 (low power DDR version 3, JESD209-3B, originally published in August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), LPDDR5 (originally published by JEDEC in February 2019), HBM2 ((HBM version 2), originally published by JEDEC in December 2018), DDR5 (DDR version 5, originally published by JEDEC in July 2020), or others or combinations of memory technologies, and technologies based on derivatives or extensions of such specifications.

FIG. 1 illustrates an example system 100. In some examples, as shown in FIG. 1, system 100 includes a processor and elements of a memory subsystem in a computing device. Processor 110 represents a processing unit of a computing platform that may execute an operating system (OS) and applications, which can collectively be referred to as the host or the user of the memory subsystem. The OS and applications execute operations that result in memory accesses. Processor 110 can include one or more separate processors. Each separate processor may include a single processing unit, a multicore processing unit, or a combination. The processing unit may be a primary processor such as a central processing unit (CPU), a peripheral processor such as a graphics processing unit (GPU), or a combination. Memory accesses may also be initiated by devices such as a network controller or hard disk controller. Such devices may be integrated with the processor in some systems or attached to the processer via a bus (e.g., a PCI express bus), or a combination. System 100 may be implemented as a system on a chip (SOC) or may be implemented with standalone components.

Reference to memory devices may apply to different memory types. Memory devices often refers to volatile memory technologies such as DRAM. In addition to, or alternatively to, volatile memory, in some examples, reference to memory devices can refer to a nonvolatile memory device whose state is determinate even if power is interrupted to the device. In one example, the nonvolatile memory device is a block addressable memory device, such as NAND or NOR technologies. A memory device may also include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

Descriptions herein referring to a "RAM" or "RAM device" can apply to any memory device that allows random access, whether volatile or nonvolatile. Descriptions referring to a "DRAM", "SDRAM, "DRAM device" or "SDRAM device" may refer to a volatile random access memory device. The memory device, SDRAM or DRAM may refer to the die itself, to a packaged memory product that includes one or more dies, or both. In some examples, a system with volatile memory that needs to be refreshed may also include at least some nonvolatile memory.

Memory controller 120, as shown in FIG. 1, may represent one or more memory controller circuits or devices for system 100. Also, memory controller 120 may include logic and/or features that generate memory access commands in response to the execution of operations by processor 110. In some examples, memory controller 120 may access one or more memory device(s) 140. For these examples, memory device(s) 140 may be SDRAM devices in accordance with any referred to above. Memory device(s) 140 may be organized and managed through different channels, where these channels may couple in parallel to multiple memory devices via buses and signal lines. Each channel may be independently operable. Thus, separate channels may be independently accessed and controlled, and the timing, data transfer, command and address exchanges, and other operations may be separate for each channel. Coupling may refer to an electrical coupling, communicative coupling, physical coupling, or a combination of these. Physical coupling may include direct contact. Electrical coupling, for example, includes an interface or interconnection that allows electrical flow between components, or allows signaling between components, or both. Communicative coupling, for example, includes connections, including wired or wireless, that enable components to exchange data.

According to some examples, settings for each channel are controlled by separate mode registers or other register settings. For these examples, memory controller 120 may manage a separate memory channel, although system 100 may be configured to have multiple channels managed by a single memory controller, or to have multiple memory controllers on a single channel. In one example, memory controller 120 is part of processor 110, such as logic and/or features of memory controller 120 are implemented on the same die or implemented in the same package space as processor 110.

Memory controller 120 includes I/O interface circuitry 122 to couple to a memory bus, such as a memory channel as referred to above. I/O interface circuitry 122 (as well as I/O interface circuitry 142 of memory device(s) 140) may include pins, pads, connectors, signal lines, traces, or wires, or other hardware to connect the devices, or a combination of these. I/O interface circuitry 122 may include a hardware interface. As shown in FIG. 1, I/O interface circuitry 122 includes at least drivers/transceivers for signal lines. Commonly, wires within an integrated circuit interface couple with a pad, pin, or connector to interface signal lines or traces or other wires between devices. I/O interface circuitry 122 can include drivers, receivers, transceivers, or termination, or other circuitry or combinations of circuitry to exchange signals on the signal lines between memory controller 120 and memory device(s) 140. The exchange of signals includes at least one of transmit or receive. While shown as coupling I/O interface circuitry 122 from memory controller 120 to I/O interface circuitry 142 of memory device(s) 140, it will be understood that in an implementation of system 100 where groups of memory device(s) 140 are accessed in parallel, multiple memory devices can include I/O interface circuitry to the same interface of memory controller 120. In an implementation of system 100 including one or more memory module(s) 170, I/O interface circuitry 142 may include interface hardware of memory module(s) 170 in addition to interface hardware for memory device(s) 140. Other memory controllers 120 may include multiple, separate interfaces to one or more memory devices of memory device(s) 140.

In some examples, memory controller 120 may be coupled with memory device(s) 140 via multiple signal lines. The multiple signal lines may include at least a clock (CLK) 132, a command/address (CMD) 134, and write data (DQ) and read data (DQ) 136, and zero or more other signal lines 138. According to some examples, a composition of signal lines coupling memory controller 120 to memory device(s) 140 may be referred to collectively as a memory bus. The signal lines for CMD 134 may be referred to as a "command bus", a "C/A bus" or an ADD/CMD bus, or some other designation indicating the transfer of commands. The signal lines for DQ 136 may be referred to as a "data bus".

According to some examples, independent channels may have different clock signals, command buses, data buses, and other signal lines. For these examples, system 100 may be considered to have multiple "buses," in the sense that an independent interface path may be considered a separate bus. It will be understood that in addition to the signal lines shown in FIG. 1, a bus may also include at least one of strobe signaling lines, alert lines, auxiliary lines, or other signal lines, or a combination of these additional signal lines. It will also be understood that serial bus technologies can be used for transmitting signals between memory controller 120 and memory device(s) 140. An example of a serial bus technology is 8B10B encoding and transmission of high-speed data with embedded clock over a single differential pair of signals in each direction. In some examples, CMD 134 represents signal lines shared in parallel with multiple memory device(s) 140. In other examples, multiple memory devices share encoding command signal lines of CMD 134, and each has a separate chip select (CS_n) signal line to select individual memory device(s) 140.

In some examples, the bus between memory controller 120 and memory device(s) 140 includes a subsidiary command bus routed via signal lines included in CMD 134 and a subsidiary data bus to carry the write and read data routed via signal lines included in DQ 136. In some examples, CMD 134 and DQ 136 may separately include bidirectional lines. In other examples, DQ 136 may include unidirectional write signal lines to write data from the host to memory and unidirectional lines to read data from the memory to the host.

According to some examples, in accordance with a chosen memory technology and system design, signals lines included in other 138 may augment a memory bus or subsidiary bus. For example, strobe line signal lines for a DQS. Based on a design of system 100, or memory technology implementation, a memory bus may have more or less bandwidth per memory device included in memory device(s) 140. The memory bus may support memory devices included in memory device(s) 140 that have either a x32 interface, a x16 interface, a x8 interface, or other interface. The convention "xW," where W is an integer that refers to an interface size or width of the interface of memory device(s) 140, which represents a number of signal lines to exchange data with memory controller 120. The interface size of these memory devices may be a controlling factor on how many memory devices may be used concurrently per channel in system 100 or coupled in parallel to the same signal lines. In some examples, high bandwidth memory devices, wide interface memory devices, or stacked memory devices, or combinations, may enable wider interfaces, such as a x128 interface, a x256 interface, a x512 interface, a x1024 interface, or other data bus interface width.

In some examples, memory device(s) 140 and memory controller 120 exchange data over a data bus via signal lines included in DQ 136 in a burst, or a sequence of consecutive data transfers. The burst corresponds to a number of transfer cycles, which is related to a bus frequency. A given transfer cycle may be a whole clock cycle for transfers occurring on a same clock or strobe signal edge (e.g., on the rising edge). In some examples, every clock cycle, referring to a cycle of the system clock, may be separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device(s) 140 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

According to some examples, memory device(s) 140 represent memory resources for system 100. For these examples, each memory device included in memory device(s) 140 is a separate memory die. Separate memory devices may interface with multiple (e.g., 2) channels per device or die. A given memory device of memory device(s) 140 may include I/O interface circuitry 142 and may have a bandwidth determined by an interface width associated with an implementation or configuration of the given memory device (e.g., x16 or x8 or some other interface bandwidth). I/O interface circuitry 142 may enable the memory devices to interface with memory controller 120. I/O interface circuitry 142 may include a hardware interface and operate in coordination with I/O interface circuitry 122 of memory controller 120.

In some examples, multiple memory device(s) 140 may be connected in parallel to the same command and data buses (e.g., via CMD 134 and DQ136). In other examples, multiple memory device(s) 140 may be connected in parallel to the same command bus but connected to different data buses. For example, system 100 may be configured with multiple memory device(s) 140 coupled in parallel, with each memory device responding to a command, and accessing memory resources 160 internal to each memory device. For a write operation, an individual memory device of memory device(s) 140 may write a portion of the overall data word, and for a read operation, the individual memory device may fetch a portion of the overall data word. As non-limiting examples, a specific memory device may provide or receive, respectively, 8 bits of a 128-bit data word for a read or write operation, or 8 bits or 16 bits (depending for a x8 or a x16 device) of a 256-bit data word. The remaining bits of the word may be provided or received by other memory devices in parallel.

According to some examples, memory device(s) 140 may be disposed directly on a motherboard or host system platform (e.g., a PCB (printed circuit board) on which processor 110 is disposed) of a computing device. Memory device(s) 140 may be organized into memory module(s) 170. In some examples, memory module(s) 170 may represent dual inline memory modules (DIMMs). In some examples, memory module(s) 170 may represent other organizations or configurations of multiple memory devices that share at least a portion of access or control circuitry, which can be a separate circuit, a separate device, or a separate board from the host system platform. In some examples, memory module(s) 170 may include multiple memory device(s) 140, and memory module(s) 170 may include support for multiple separate channels to the included memory device(s) 140 disposed on them.

In some examples, memory device(s) 140 may be incorporated into a same package as memory controller 120. For example, incorporated in a multi-chip-module (MCM), a package-on-package with through-silicon via (TSV), or other techniques or combinations. Similarly, in some examples, memory device(s) 140 may be incorporated in memory module(s) 170, which themselves may be incorporated into the same package as memory controller 120. It will be appreciated that for these and other examples, memory controller 120 may be part of or integrated with processor 110.

As shown in FIG. 1, in some examples, memory device(s) 140 include memory resources 160. Memory resources 160 may represent individual arrays of memory locations or storage locations for data. Memory resources 160 may be managed as rows of data, accessed via wordline (rows) and bitline (individual bits within a row) control. Memory resources 160 may be organized as separate channels, ranks, and banks of memory. Channels may refer to independent control paths to storage locations within memory device(s) 140. Ranks may refer to common locations across multiple memory devices (e.g., same row addresses within different memory devices). Banks may refer to arrays of memory locations within a given memory device of memory device(s) 140. Banks may be divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to access memory resources 160. For example, the same physical memory locations can be accessed over a specific channel as a specific bank, which can also belong to a rank. Thus, the organization of memory resources 160 may be understood in an inclusive, rather than exclusive, manner.

According to some examples, as shown in FIG. 1, memory device(s) 140 include one or more register(s) 144. Register(s) 144 may represent one or more storage devices or storage locations that provide configuration or settings for operation memory device(s) 140. In one example, register(s) 144 may provide a storage location for memory device(s) 140 to store data for access by memory controller 120 as part of a control or management operation. For example, register(s) 144 may include one or more mode registers (MRs) and/or may include one or more multipurpose registers.

In some examples, writing to or programming one or more registers of register(s) 144 may configure memory device(s) 140 to operate in different "modes". For these examples, command information written to or programmed to the one or more register may trigger different modes within memory device(s) 140. Additionally, or in the alternative, different modes can also trigger different operations from address information or other signal lines depending on the triggered mode. Programmed settings of register(s) 144 may indicate or trigger configuration of I/O settings. For example, configuration of timing, termination, on-die termination (ODT), driver configuration, or other I/O settings.

According to some examples, memory device(s) 140 includes ODT 146 as part of the interface hardware associated with I/O interface circuitry 142. ODT 146 may provide settings for impedance to be applied to the interface to specified signal lines. For example, ODT 146 may be configured to apply impedance to signal lines include in DQ 136 or CMD 134. The ODT settings for ODT 146 may be changed based on whether a memory device of memory device(s) 140 is a selected target of an access operation or a non-target memory device. ODT settings for ODT 146 may affect timing and reflections of signaling on terminated signal lines included in, for example, CMD 134 or DQ 136. Control over ODT setting for ODT 146 can enable higher-speed operation with improved matching of applied impedance and loading. Impedance and loading may be applied to specific signal lines of I/O interface circuitry 142, 122 (e.g., CMD 134 and DQ 136) and is not necessarily applied to all signal lines.

In some examples, as shown in FIG. 1, memory device(s) 140 includes controller 150. Controller 150 may represent control logic within memory device(s) 140 to control internal operations within memory device(s) 140. For example, controller 150 decodes commands sent by memory controller 120 and generates internal operations to execute or satisfy the commands. Controller 150 may be referred to as an internal controller and is separate from memory controller 120 of the host. Controller 150 may include logic and/or features to determine what mode is selected based on programmed or default settings indicated in register(s) 144 and configure the internal execution of operations for access to memory resources 160 or other operations based on the selected mode. Controller 150 generates control signals to control the routing of bits within memory device(s) 140 to provide a proper interface for the selected mode and direct a command to the proper memory locations or addresses of memory resources 160. Controller 150 includes command (CMD) logic 152, which can decode command encoding received on command and address signal lines. Thus, CMD logic 152 can be or include a command decoder. With command logic 152, memory device can identify commands and generate internal operations to execute requested commands.

Referring again to memory controller 120, memory controller 120 includes CMD logic 124, which represents logic and/or features to generate commands to send to memory device(s) 140. The generation of the commands can refer to the command prior to scheduling, or the preparation of queued commands ready to be sent. Generally, the signaling in memory subsystems includes address information within or accompanying the command to indicate or select one or more memory locations where memory device(s) 140 should execute the command. In response to scheduling of transactions for memory device(s) 140, memory controller 120 can issue commands via I/O interface circuitry 122 to cause memory device(s) 140 to execute the commands. In some examples, controller 150 of memory device(s) 140 receives and decodes command and address information received via I/O interface circuitry 142 from memory controller 120. Based on the received command and address information, controller 150 may control the timing of operations of the logic, features and/or circuitry within memory device(s) 140 to execute the commands. Controller 150 may be arranged to operate in compliance with standards or specifications such as timing and signaling requirements for memory device(s) 140. Memory controller 120 may implement compliance with standards or specifications by access scheduling and control.

According to some examples, memory controller 120 includes scheduler 130, which represents logic and/or features to generate and order transactions to send to memory device(s) 140. From one perspective, the primary function of memory controller 120 could be said to schedule memory access and other transactions to memory device(s) 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

In some examples, memory controller 120 includes refresh (REF) logic 126. REF logic 126 may be used for memory resources that are volatile and need to be refreshed to retain a deterministic state. REF logic 126, for example, may indicate a location for refresh, and a type of refresh to perform. REF logic 126 may trigger self-refresh within memory device(s) 140 or execute external refreshes which can be referred to as auto refresh commands by sending refresh commands, or a combination. According to some examples, system 100 supports all bank refreshes as well as per bank refreshes. All bank refreshes cause the refreshing of banks within all memory device(s) 140 coupled in parallel. Per bank refreshes cause the refreshing of a specified bank within a specified memory device of memory device(s) 140. In some examples, controller 150 within memory device(s) 140 includes a REF logic 154 to apply refresh within memory device(s) 140. REF logic 154, for example, may generate internal operations to perform refresh in accordance with an external refresh received from memory controller 120. REF logic 154 may determine if a refresh is directed to memory device(s) 140 and determine what memory resources 160 to refresh in response to the command.

Memory controller 120 includes DCA training algorithms 128. DCA training algorithms 128 refers to logic in memory controller 120 to execute the DCA training algorithms described herein. The DCA training algorithms are implemented in conjunction with associated circuitry and logic on memory device(s) 140, including a DCA function 180 that adjusts one or more DQS transmitter (TX) clock trees 182, which provide 4-phase clock inputs to memory resources 160. As described in further detail below, DCA training algorithm 128 provide inputs to memory devices 140 to change the values of DCA mode registers 184.

Data pins in the DDR circuitry are labeled 'DQ' and the strobe pin is labeled 'DQS'. RAM that use DDR are designed to transfer two data words per clock cycle, using both the positive and the negative edge of the clock. With each word of data, a data-strobe (clock) is transferred for synchronization. For DDR5, the DQS clock tree is internally generated by using a multi-phase clock(s). In the case of DQS clock tree using a 4-phase internal clocks, the DDR5 specification defines the phases as: ICLK (0°); QCLK (90°); IBCLK (180°); and QBCLK (270°). Ideally, ICLK, QCLK, IBCLK, and QBCLK are 90° apart from each other. Also, in the ideal cases there should not be any duty cycle error. In practical cases however, there is some degree of duty cycle error that has been observed in the DDR5 DRAM devices. This in turn causes the increase in the output duty cycle induced Jitter, which in turn can cause system failure.

DDR5 SDRAM supports a mode register adjustable DCA function (e.g., DCA function 180) that allows the memory controller to adjust the DRAM internally generated DQS clock tree and DQ duty cycle that could compensate for the associated duty cycle errors. For the 4-phase clocks scheme, the even and odd duty-cycle ratio of all DQS per device can be respectively adjusted since the internal 4-phase clocks can be independently controlled by a DCA code. For adjusting the clock phases for DQS, the memory controller can adjust the duty cycle by setting applicable DCA code values in the DCA mode registers MR43 (QCLK & IBCLK) & MR44 (QBCLK). The global DCA step range is from −7 to +7.

Figure 2A:
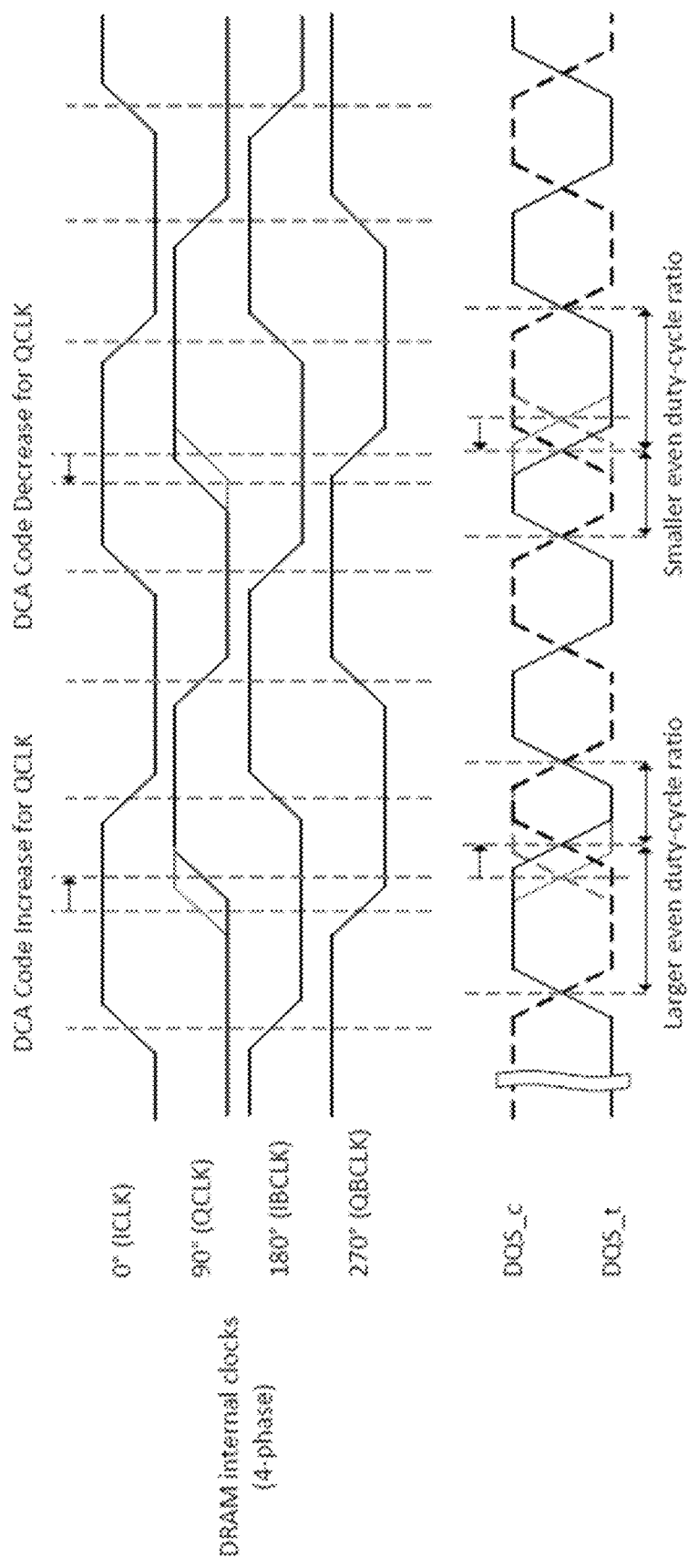
FIG. 2a is a diagram illustrating the relationship between a DCA code change for QCLK and the 4-Phase Internal Clocks and the DQS_c and DQS_t waveforms.
Figure 2B:
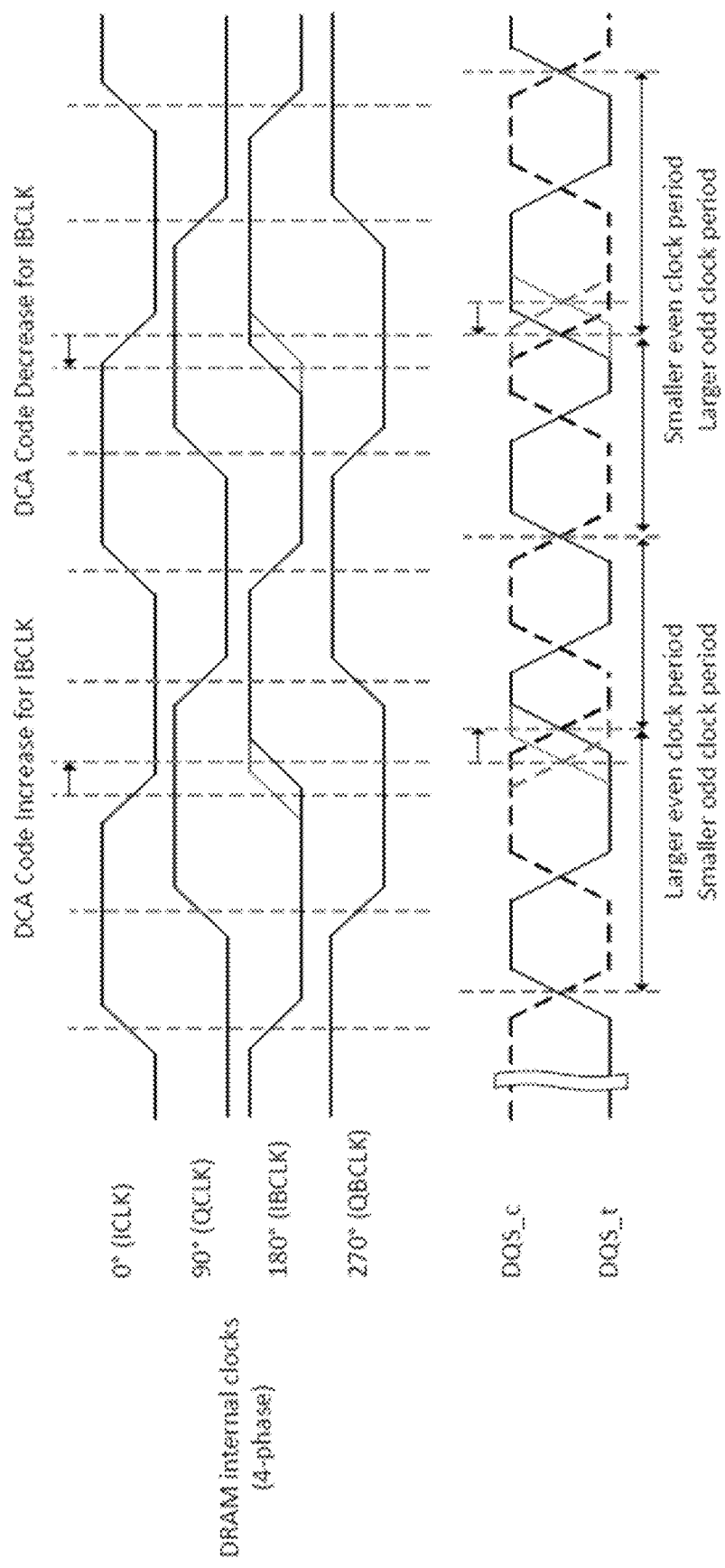
FIG. 2b is a diagram illustrating the relationship between a DCA code change for IBCLK and the 4-Phase Internal Clocks and the DQS_c and DQS_t waveforms.
Figure 2C:
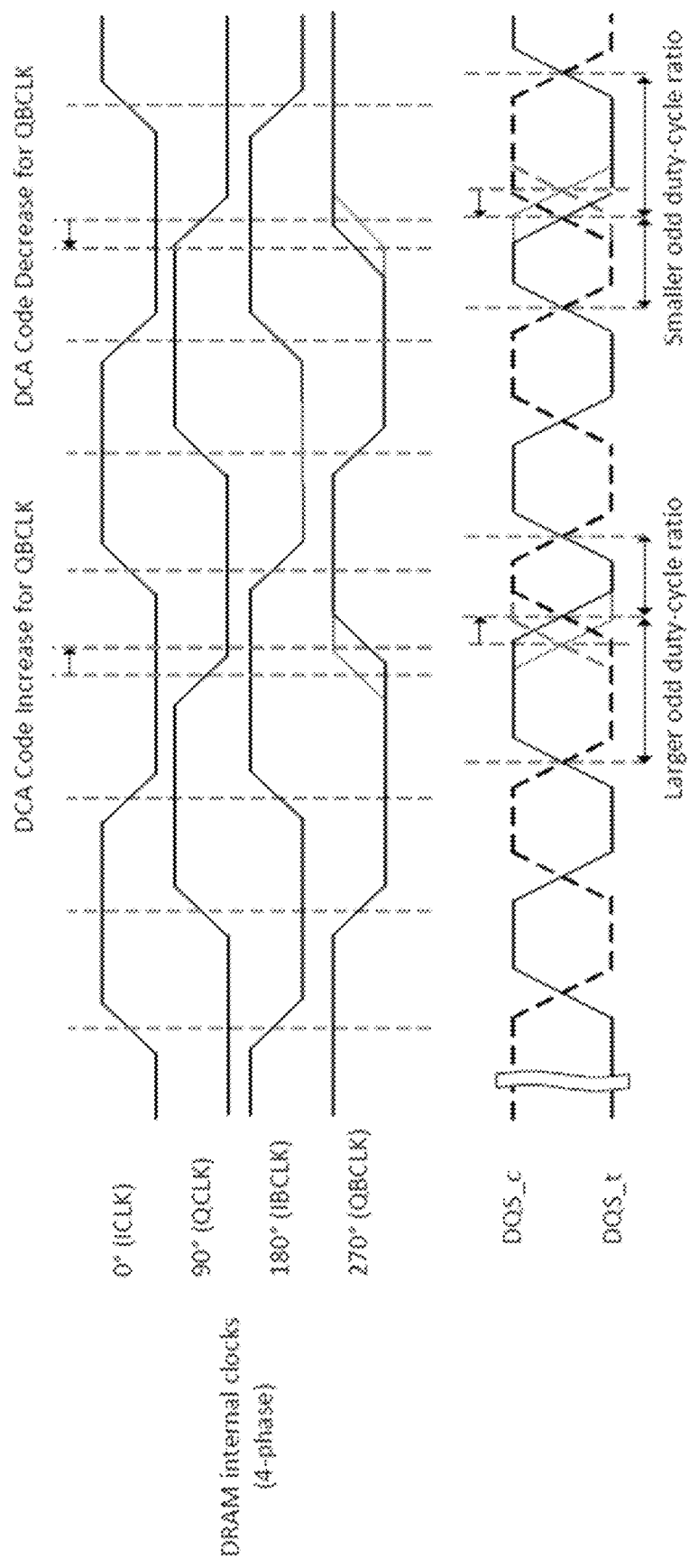
FIG. 2c is a diagram illustrating the relationship between a DCA code change for QBCLK and the 4-Phase Internal Clocks and the DQS_c and DQS_t waveforms.

FIG. 2a shows the relationship between a DCA code change for QCLK and the 4-Phase Internal Clocks and the DQS_c and DQS_t waveforms. FIG. 2b shows the relationship between a DCA code change for IBCLK and the 4-Phase Internal Clocks and the DQS_c and DQS_t waveforms. Similarly, FIG. 2c shows the relationship between a DCA code change for QBCLK and the 4-Phase Internal Clocks and the DQS_c and DQS_t waveforms. For each of QCLK, IBCLK, and QBCLK a positive DCA adjustment (increase in the DCA code) will increase the duty cycle and negative DCA adjustment (decrease in the DCA code) will decrease the duty cycle associated with that clock. However, these changes will also affect the clock edge next to it.

DCA training may be performed on the next clock edge in an iterative manner until all four edges in a 4-phase clock has been optimized. For example, the DCA function can be used to run a blind search algorithm with all (or recommended) DCA (Duty Cycle Adjuster) steps to get the optimum of ΣnUI DJ, where n=1,2,3, UI is Unit Interval and DJ is Distortion Jitter. Under the blind search algorithm considering all step values in all combinations, 15×15×15=3375 DCA steps are performed to obtain the adjustment of the DQS clock tree and DQ duty cycle.

Under embodiments herein, Basic and Advanced DCA training algorithms are implemented to reduce the duty cycle error and hence reduce the phase mismatch translated jitter in the DRAM output DQS and DQ signals. In accordance with aspects of the Basic and Advanced DCA training algorithms, the DCA search is reduced to 90 steps, which saves time and also improves jitter without having to perform the blind search. These algorithms can be implemented during the BIOS training in the system and/or in the Bench or ATE (Automated Test Equipment). Once the optimized DCA codes for QCLK, IBCLK, and QBCLK are determined, the memory controller will issue the best mode register settings for DCA, which removes the phase mismatch translated jitter.

Basic DCA Training Algorithm

Figure 3:
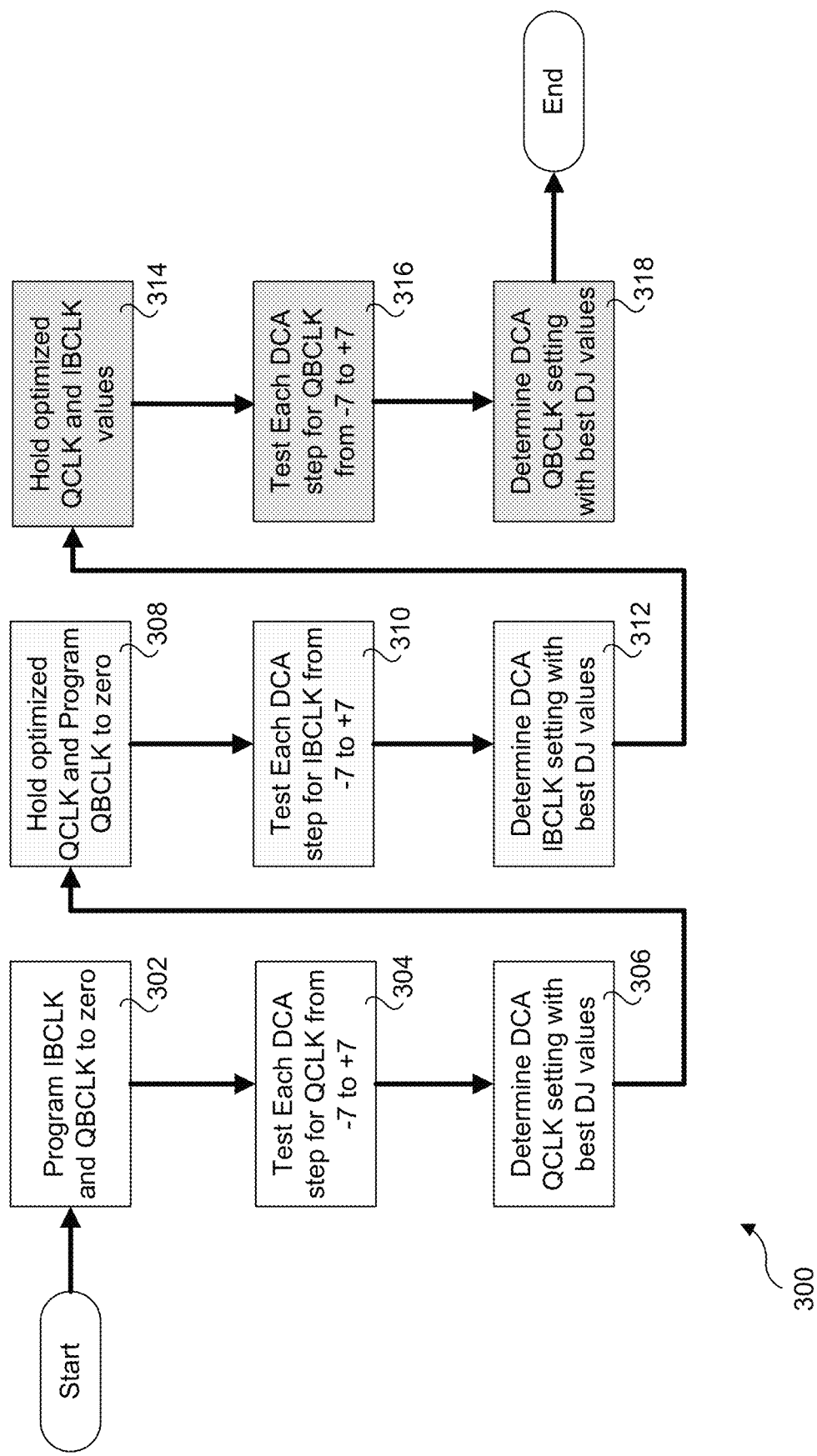
FIG. 3 is a process flow diagram illustrating operations performed by the Basic DCA training algorithm, according to one embodiment.

FIG. 3 shows a process flow diagram 300 illustrating operations performed by the basic DCA training algorithm, according to one embodiment. During a first phase, the basic DCA training algorithm performs a blind search with each step increment in the QCLK, from DCA +7 to −7. On each increment, the corresponding summation of the nUI (n=1, 2,3) Deterministic Jitter (nUI DJ) is calculated and recorded. The QCLK value that results in the lowest summation of nUI DJ is the determined as the optimized QCLK value. A similar set of operations is performed for the IBCLK and QBCLK during second and third phases to identify optimized IBCLK and QBCLK values.

In the Basic DCA algorithm, the programming of QCLK, IBCLK and QBCLK are as follows:

1) When optimizing the QCLK, IBCLK and QBCLK are programmed to zero.
2) When optimizing the IBCLK, we hold the optimized value for QCLK obtained in previous step is held and the QBCLK is programmed to zero.
3) When optimizing the QBCLK, the optimized values for QCLK and IBCLK obtained in previous steps is held.

As shown in FIG. 3, following a start block the IBCLK and QBCLK values are programmed to zero in a block 302. Each DCA step for the QCLK setting over the range from DCA +7 to −7 is then tested, as shown in a block 304. Following the set of operations for QCLK, the DCA QCLK setting with the best DJ values (lowest sum of the nUI DJ) is determined in a block 306 as the Basic optimized DCA QCLK value. This completes the first phase of the Basic DCA algorithm for the DCA QCLK. Further details of the operations for this first phase are shown in FIG. 4 and described below.

Next, a set of operations to determine the optimized IBCLK during the second phase of the Basic DCA algorithm is performed. During this phase, the optimized QCLK value determined in block 306 is held, while the QBCLK value is programmed to zero, as shown in a block 308. As before, each DCA step from DCA +7 to −7 is tested for the IBCLK in a block 310. The DCA IBCLK setting with the best DJ values is then determined in a block 312 as the optimized DCA IBCLK value, completing the second phase of the algorithm.

During the third phase of the Basic DCA algorithm, the optimized values for QCLK and IBCLK determined during the first and a second phases are held, as shown in a block 314. Again, each DCA step from DCA +7 to −7 is tested for QBCLK in a block 316. The DCA QBCLK setting with the best DJ values is then identified in a block 318 as the optimized DCA QBCLK value, completing the third phase of the Basic DCA algorithm. As shown by the end block, this also completes the Basic DCA algorithm.

Figure 4:
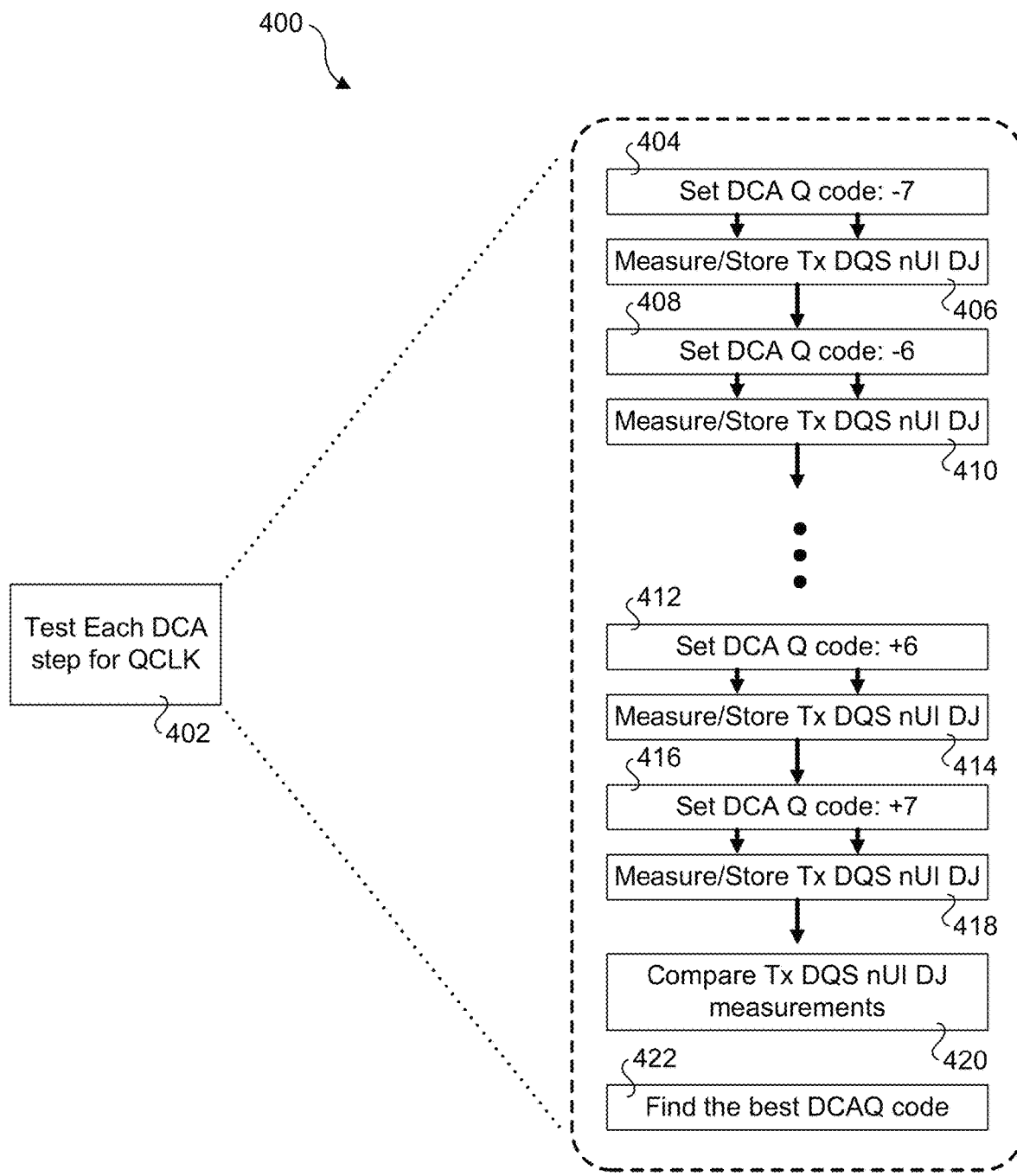
FIG. 4 is a diagram illustrating the Basic DCA search algorithm that is being performed for QCLK using a DCA Q code range from +7 to −7

FIG. 4 shows a diagram 400 illustrating the Basic DCA search algorithm that is being performed for QCLK using a DCA Q code range from +7 to −7. The best value of DCA QCLK setting is found by selecting the least value of the summation of nUI DJ amongst the 15 measured values. This process will be done for QCLK, IBCLK and QBCLK, corresponding to the operations in blocks 304, 310, and 316 of FIG. 3, respectively.

As shown in a block 402, each DCA step for QCLK is tested. In a block 404, the DCA Q code is set to −7 by programming the MR43 register. The Tx DQS nUI DJ is then measured and stored in a block 406 and stored. In a block 408, the DCA Q code is set to −6 by programming the MR43 register. The Tx DQS nUI DJ is then measured and stored in a block 410. As shown by the ellipses and setting the DCS code to +6 and +7 in blocks 412 and 416 and corresponding measurements of Tx DQS nUI DJ in blocks 414 and 418, this pattern of setting the DCA Q code and measuring and storing the Tx DQS nUI DJ is repeated for DCA code values −5, −4, −3, −2, −1, 0, +1, +2, +3, +4, +5, +6, and +7. The Tx DQS nUI DJ measurements are compared in a block 420 to find the best DCAQ code in a block 422.

As an option, the best running QCLK value and nUI DJ summation may be stored rather than storing the QCLK value and nUI DJ summation for each iteration. For example, this approach would start with initial best QCLK and nUI DJ summation values as those use for the first iteration (e.g., at a QCLK setting of −7). The best QCLK and nUI DJ summation values would only be undated when the nUI DJ summation result is less than the current best result for a subsequent iteration.

Advanced DCA Training Algorithm

Figure 5:
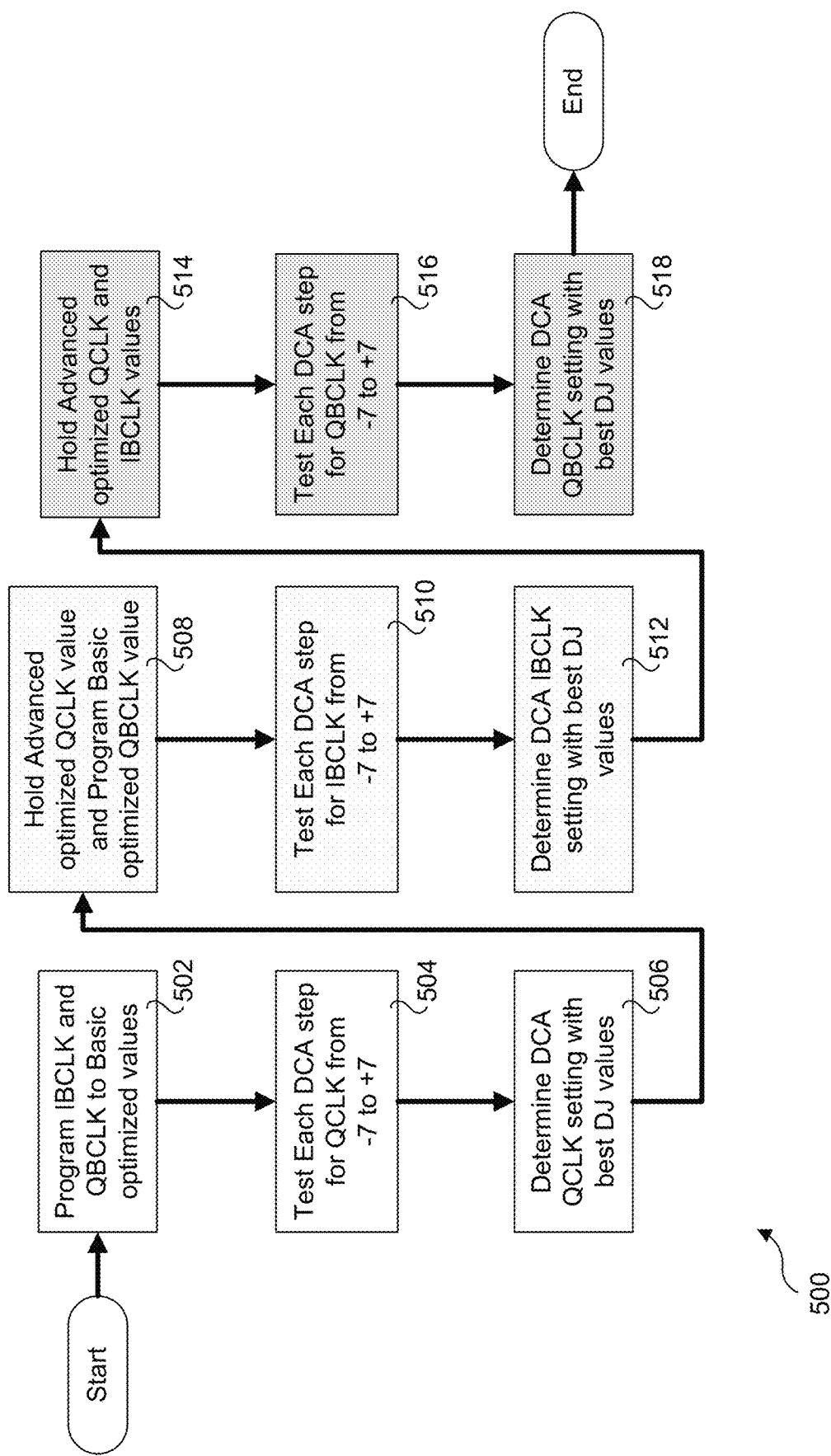
FIG. 5 is a process flow diagram illustrating operations performed by the Advanced DCA training algorithm, according to one embodiment.

After the Basic DCA training algorithm has been completed, an Advanced DCA training algorithm is performed. In the Advanced DCA training algorithm, the following programming of QCLK, IBCLK and QBCLK are used:
1) When optimizing the QCLK, we program IBCLK and QBCLK to their respective optimized values obtained in the Basic DCA training steps
2) When optimizing the IBCLK, we hold the optimized value for QCLK obtained in previous step within the Advanced DCA training step and program the QBCLK to its optimized value obtained in the Basic DCA training step
3) When optimizing the QBCLK, we hold the optimized values for QCLK and IBCLK obtained in previous steps withing the Advanced DCA training step FIG. 5 shows a process flow diagram 500 illustrating operations performed by the Advanced DCA training algorithm, according to one embodiment. In a block 502 the IBCLK and QBCLK values are programmed their optimized values determined using the Basic DCA training algorithm. Each DCA step for the QCLK setting over the range from DCA +7 to −7 is then tested in a block 504. The DCA QCLK setting with the best DJ values is determined in a block 506 as the Advanced optimized DCA QCLK value.

During the second phase, the optimized QCLK value determined in block 506 is held, while the optimized QBCLK value from the Basic DCA algorithm is programmed, as shown in a block 508. Each DCA step from DCA +7 to −7 is then tested for the IBCLK in a block 510. The DCA IBCLK setting with the best DJ values is then determined in a block 512 as the Advanced optimized DCA IBCLK value, completing the second phase of the Advanced algorithm.

During the third phase of the Advanced DCA algorithm, the optimized values for QCLK and IBCLK determined during the first and a second phases are held, as shown in a block 514. As before, each DCA step from DCA +7 to −7 is tested for QBCLK in a block 516. The DCA QBCLK setting with the best DJ values is then identified in a block 518 as the optimized DCA QBCLK value, completing the third phase of the algorithm. As shown by the end block, this also completes the algorithm.

Training Algorithms for Optimizing DQ Signals

In accordance with further aspects of some embodiment, training may be performed for DQ signals to reduce duty cycle error and jitter in a similar manner to the algorithms described above for DQS signals. The general operations of flowcharts 300 and 500 are similar, except for DCA mode registers MR133 (QCLK & IBCLK) and MR134 (QBCLK) or used rather than DCA mode registers MR43 and MR44, and the adjustment is applied to the DQ signals rather than the DQS signals.

Figure 6:
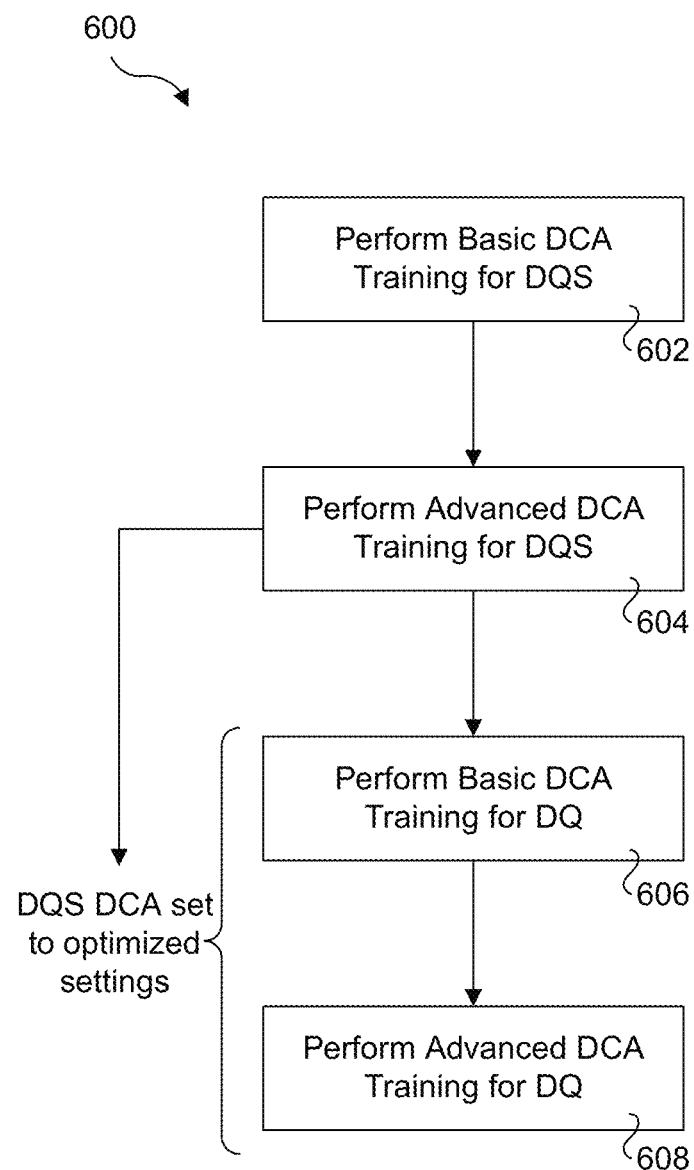
FIG. 6 is a block diagram of an exemplary system in which aspects of the embodiments disclosed herein may be implemented.

As shown in a flowchart 600 in FIG. 6, the process for DCA adjustment of DQ signals is performed using four phases. During a first phase 602, basic DCA training is performed for DQS signals. During a second phase 604, advanced DCA training is performed for DQS signals. At this point the DCA adjustment for the DQS clock phases have been optimizes and these settings are maintained for the remainder of the process. During a third phase 606, basic DCA training is performed for DQ signals, while. During a fourth phase 608, advanced DCA training is performed for DQ signals. Thus, basic and advanced DCA training for DQS signals is first performed, followed by basic and advanced DCA training for DQ signals using the optimized DCA settings for DQS.

Figure 7:
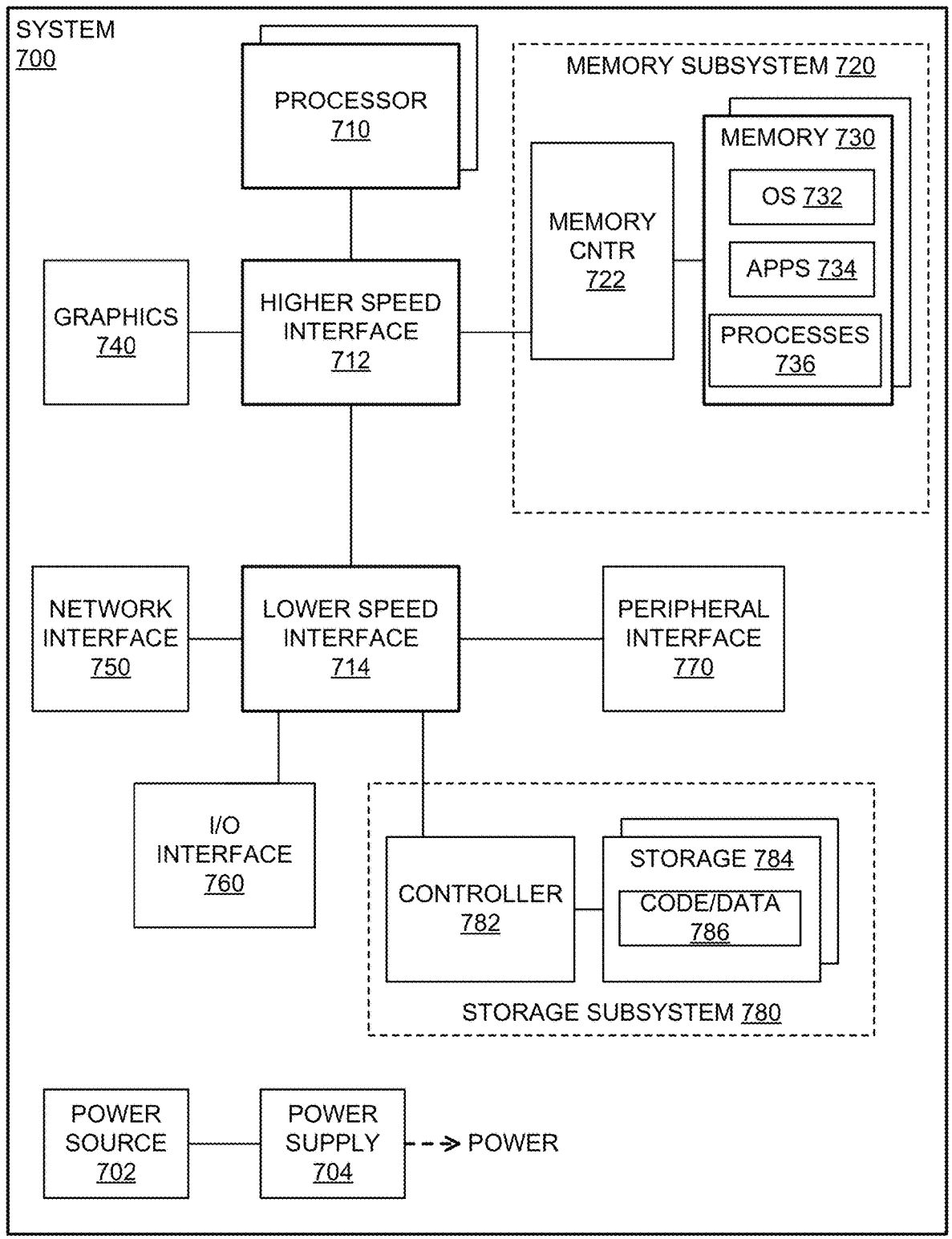
FIG. 7 is a block diagram of a system in which aspects of the embodiments herein may be implemented.

FIG. 7 illustrates an example system 700. In some examples, system 700 may be a computing system in which a memory system may implement DCA training algorithms. System 700 represents a computing device in accordance with any example described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 700 includes processor 710, which provides processing, operation management, and execution of instructions for system 700. Processor 710 can include any type of microprocessor, central processing unit (CPU), graphics processing unit (GPU), processing core, or other processing hardware to provide processing for system 700, or a combination of processors. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 700 includes interface 712 coupled to processor 710, which can represent a higher speed interface or a high throughput interface for system components that needs higher bandwidth connections, such as memory subsystem 720 or graphics interface components 740. Interface 712 represents an interface circuit, which can be a standalone component or integrated onto a processor die. Where present, graphics interface 740 interfaces to graphics components for providing a visual display to a user of system 700. In one example, graphics interface 740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 740 generates a display based on data stored in memory 730 or based on operations executed by processor 710 or both. In one example, graphics interface 740 generates a display based on data stored in memory 730 or based on operations executed by processor 710 or both.

Memory subsystem 720 represents the main memory of system 700 and provides storage for code to be executed by processor 710, or data values to be used in executing a routine. Memory 730 of memory subsystem 720 may include one or more memory devices such as read-only memory (ROM), flash memory, one or more varieties of random access memory (RAM) such as DRAM, or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more I/O interface(s) 760. I/O interface(s) 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage subsystem 780 can overlap with components of memory subsystem 720. Storage subsystem 780 includes storage device(s) 784, which can be or include any conventional medium for storing large amounts of data in a nonvolatile manner, such as one or more magnetic, solid state, or optical based disks, or a combination. Storage device(s) 784 holds code or instructions and data 786 in a persistent state (i.e., the value is retained despite interruption of power to system 700). Storage device(s) 784 can be generically considered to be a "memory," although memory 730 is typically the executing or operating memory to provide instructions to processor 710. Whereas storage device(s) 784 is nonvolatile, memory 730 can include volatile memory (i.e., the value or state of the data is indeterminate if power is interrupted to system 700). In one example, storage subsystem 780 includes controller 782 to interface with storage device(s) 784. In one example controller 782 is a physical part of interface 714 or processor 710 or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

As discussed above, various aspects of the embodiments herein may be facilitated by corresponding software and/or firmware components and applications, such as software and/or firmware executed by an embedded processor or the like. Thus, embodiments of this invention may be used as or to support a software program, software modules, firmware, and/or distributed software executed upon some form of processor, processing core or embedded logic a virtual machine running on a processor or core or otherwise implemented or realized upon or within a non-transitory computer-readable or machine-readable storage medium. A non-transitory computer-readable or machine-readable storage medium includes any mechanism for storing or transmitting information in a form readable by a machine (e.g., a computer). For example, a non-transitory computer-readable or machine-readable storage medium includes any mechanism that provides (i.e., stores and/or transmits) information in a form accessible by a computer or computing machine (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A non-transitory computer-readable or machine-readable storage medium may also include a storage or database from which content can be downloaded. The non-transitory computer-readable or machine-readable storage medium may also include a device or product having content stored thereon at a time of sale or delivery. Thus, delivering a device with stored content, or offering content for download over a communication medium may be understood as providing an article of manufacture comprising a non-transitory computer-readable or machine-readable storage medium with such content described herein.

Various components referred to above as processes, servers, or tools described herein may be a means for performing the functions described. The operations and functions performed by various components described herein may be implemented by software running on a processing element, via embedded hardware or the like, or any combination of hardware and software. Such components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration information, etc.) may be provided via an article of manufacture including non-transitory computer-readable or machine-readable storage medium, which provides content that represents instructions that can be executed. The content may result in a computer performing various functions/operations described herein.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A memory controller comprising:
   Input/Output (I/O) interface circuitry, including an input clock signal, configured to be coupled to I/O interface circuitry on a Synchronous Dynamic Random Access Memory (SDRAM) module; and
   Duty Cycle Adjuster (DCA) training logic for adjusting a four-phase clock for the SDRAM module including an 0° phase (ICLK), a 90° phase (QCLK), a 180° phase (IBCLK), and a 270° phase (QBCLK), the DCA training logic to:
   adjust a duty-cycle ratio for QCLK while holding duty-cycle ratios for IBCLK and QBCLK at predetermined values to determine a first optimized duty-cycle ratio;
   adjust the duty-cycle ratio for IBCLK while holding the duty-cycle ratio for QCLK at the first optimized duty-cycle ratio and holding the duty-cycle ratio for QBCLK at a predetermined value to determine a second optimized duty-cycle ratio; and
   adjust the duty-cycle ratio for QBCLK while holding the duty-cycle ratio for QCLK at the first optimized duty-cycle ratio and holding the duty-cycle ratio for IBCLK at the second optimized duty-cycle ratio to determine a third optimized duty-cycle ratio.

2. The memory controller of claim 1, wherein the first optimized duty-cycle ratio is determined by measuring a transmitter (Tx) data strobe (DQS) deterministic jitter while adjusting the duty-cycle ratio of QCLK, wherein the first optimized duty-cycle ratio corresponds to a duty-cycle ratio for QCLK having a lowest deterministic jitter.

3. The memory controller of claim 1, wherein the duty-cycle ratios of QCLK, IBCLK, and QBCLK are adjusted by programming one or more mode registers on the DRAM module with an associated DCA code for QCLK, IBCLK, and QBCLK.

4. The memory controller of claim 3, wherein the DCA code for QCLK, IBCLK, and QBCLK is adjusted over a range from −7 to +7.

5. The memory controller of claim 3, wherein the predetermined duty-cycle ratios for QCLK, IBCLK, and QBCLK are held by programming the DCA code for QCLK, IBCLK, and QBCLK to 0.

6. The memory controller of claim 1, wherein the DCA training logic is further configured to:
   adjust a duty-cycle ratio for QCLK while holding a duty-cycle ratio for IBCLK at the second optimized duty-cycle ratio and the duty-ratio for QBCLK at the third duty-cycle ratio to determine a fourth optimized duty-cycle ratio;
   adjust the duty-cycle ratio for IBCLK while holding the duty-cycle ratio for QCLK at the fourth optimized duty-cycle ratio and holding the duty-cycle ratio for QBCLK at the third optimized duty-cycle ratio to determine a fifth optimized duty-cycle ratio; and
   adjust the duty-cycle ratio for QBCLK while holding the duty-cycle ratio for QCLK at the fourth optimized duty-cycle ratio and holding the duty-cycle ratio for IBCLK at the fifth optimized duty-cycle ratio to determine a sixth optimized duty-cycle ratio.

7. A system, comprising:
   a Synchronous Dynamic Random Access Memory (SDRAM) module having first Input/Output (I/O) interface circuitry via which an input clock signal is received and including circuitry to implement a data strobe (DQS) clock tree comprising four-phase clocks including an 0° phase (ICLK), a 90° phase (QCLK), a 180° phase (IBCLK), and a 270° phase (QBCLK),
   a memory controller comprising:
      second I/O interface circuitry communicatively coupled to the first I/O circuitry on the SDRAM module and including an input clock signal sent from the memory controller to the SDRAM module; and
      Duty Cycle Adjuster (DCA) training logic to:
         adjust a duty-cycle ratio for QCLK while holding duty-cycle ratios for IBCLK and QBCLK at predetermined values to determine a first optimized duty-cycle ratio;
         adjust the duty-cycle ratio for IBCLK while holding the duty-cycle ratio for QCLK at the first optimized duty-cycle ratio and holding the duty-cycle ratio for QBCLK at a predetermined value to determine a second optimized duty-cycle ratio; and
         adjust the duty-cycle ratio for QBCLK while holding the duty-cycle ratio for QCLK at the first optimized duty-cycle ratio and holding the duty-cycle ratio for IBCLK at the second optimized duty-cycle ratio to determine a third optimized duty-cycle ratio.

8. The system of claim 7, wherein the first optimized duty-cycle ratio is determined by measuring a transmitter (Tx) DQS deterministic jitter while adjusting the duty-cycle ratio of QCLK, wherein the first optimized duty-cycle ratio corresponds to a duty-cycle ratio for QCLK having a lowest deterministic jitter.

9. The system of claim 7, wherein the SDRAM module includes a plurality of mode registers, and wherein the duty-cycle ratios of QCLK, IBCLK, and QBCLK are adjusted by programming one or more mode registers on the SDRAM module with an associated DCA code for QCLK, IBCLK, and QBCLK.

10. The system of claim 9, wherein the DCA code for QCLK, IBCLK, and QBCLK is adjusted over a range from −7 to +7.

11. The system of claim 9, wherein the predetermined duty-cycle ratios for QCLK, IBCLK, and QBCLK are held by programming the DCA code for QCLK, IBCLK, and QBCLK to 0.

12. The system of claim 7, wherein the DCA training logic is further configured to:
   adjust a duty-cycle ratio for QCLK while holding a duty-cycle ratio for IBCLK at the second optimized duty-cycle ratio and the duty-ratio for QBCLK at the third duty-cycle ratio to determine a fourth optimized duty-cycle ratio;
   adjust the duty-cycle ratio for IBCLK while holding the duty-cycle ratio for QCLK at the fourth optimized duty-cycle ratio and holding the duty-cycle ratio for QBCLK at the third optimized duty-cycle ratio to determine a fifth optimized duty-cycle ratio;

adjust the duty-cycle ratio for QBCLK while holding the duty-cycle ratio for QCLK at the fourth optimized duty-cycle ratio and holding the duty-cycle ratio for IBCLK at the fifth optimized duty-cycle ratio to determine a sixth optimized duty-cycle ratio; and set the duty-cycle ratio for QCLK at the fourth optimized duty-cycle ratio, set the duty-cycle ration for IBCLK at the fifth optimized duty-cycle ratio, and set the duty-cycle ration for QBCLK at the six optimized duty-cycle ratio while accessing data stored on the SDRAM module.

13. A method for adjusting a four-phase Dynamic Random Access Memory (DRAM) clock including an 0° phase (ICLK), a 90° phase (QCLK), a 180° phase (IBCLK), and a 270° phase (QBCLK), comprising:

adjusting a duty-cycle ratio of a first phase among ICLK, QCLK, IBCLK, and QBCLK while holding the duty-cycle ratio of at least two other phases at a predetermined value to determine a first optimized duty-cycle ratio;

adjusting a duty-cycle ratio of a second phase among ICLK, QCLK, IBCLK, and QBCLK while holding the duty-cycle ratio for the first phase at the first optimized duty-cycle ratio and holding the duty-cycle ratio of at least one other phase at a predetermined value to determine a second optimized duty-cycle ratio; and adjusting a duty-cycle ratio of a third phase among ICLK, QCLK, IBCLK, and QBCLK while holding the duty-cycle ratio for the first phase at the first optimized duty-cycle ratio and holding the duty-cycle ratio of the second phase at the second optimized duty-cycle ratio to determine a third optimized duty-cycle ratio.

14. The method of claim 13, further comprising measuring a transmitter (Tx) data strobe (DQS) deterministic jitter while adjusting the duty-cycle ratio of the first phase, second phase, and third phase to determine the first, second, and third optimized duty-cycle ratios, respectively.

15. The method of claim 13, wherein the method is implemented by a memory controller including a duty-cycle adjustor (DCA) function and the DRAM comprises Double Data Rate (DDR) fifth generation (DDR5) or later generation Synchronous DRAM (SDRAM), and wherein the first, second, and third phases are QCLK, IBCLK, and QBCLK, respectively, further comprising:

adjusting the duty-cycle ratio for each of QCLK, IBCLK, and QBCLK by programming respective DCA codes for QCLK, IBCLK, and QBCLK in one or more mode registers on a DDR5 or later generation SDRAM memory module coupled to the memory controller.

16. The method of claim 15, wherein the DCA code for QCLK, IBCLK, and QBCLK is adjusted over a range from −7 to +7.

17. The method of claim 15, further comprising:

programming the DCA code for IBCLK and QBCLK to 0 prior to adjusting the duty-cycle ratio for QCKL; and programming the DCA code for QBCLK to zero and programming the DCA code for IBCLK to the DCA code used to obtain the second optimized duty-cycle value while adjusting the duty-cycle ratio for QBCLK.

18. The method of claim 13, wherein the first, second, and third optimized duty-cycle ratios are determined using a first algorithm, further comprising performing a second algorithm comprising:

adjusting the duty-cycle ratio of the first phase while holding the duty-cycle ratio of the second and third phases at the second and third optimized duty cycle values to determine a fourth optimized duty-cycle ratio;

adjusting the duty-cycle ratio of the second phase while holding the duty-cycle ratio for the first phase at the fourth optimized duty-cycle ratio and holding the duty-cycle ratio of the third phase at the third optimized duty-cycle ratio to determine a fifth optimized duty-cycle ratio; and adjusting the duty-cycle ratio of the third phase while holding the duty-cycle ratio for the first phase at the fourth optimized duty-cycle ratio and holding the duty-cycle ratio of the second phase at the fifth optimized duty-cycle ratio to determine a sixth optimized duty-cycle ratio.

19. The method of claim 18, further comprising measuring a transmitter (Tx) data strobe (DQS) deterministic jitter while adjusting the duty-cycle ratio of the first phase, second phase, and third phase to determine the fourth, fifth, and six optimized duty-cycle ratios, respectively.

20. The method of claim 18, further comprising:

performing a first iteration of the first algorithm and second algorithm to adjust duty-cycle ratios for a transmitter (Tx) data strobe (DQS) clock tree; and performing a second iteration of the first algorithm and second algorithm to adjust duty-cycle ratios of a Tx DQ signal.

* * * * *